(12) United States Patent
Xing et al.

(10) Patent No.: US 10,804,418 B2
(45) Date of Patent: Oct. 13, 2020

(54) PHOTODETECTOR AND METHOD FOR FABRICATING THE SAME

(71) Applicant: UNITED MICROELECTRONICS CORP., Hsinchu (TW)

(72) Inventors: Guo-Zhong Xing, Singapore (SG); Cheng-Yu Hsieh, Hsinchu County (TW); Chien-En Hsu, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/283,895

(22) Filed: Feb. 25, 2019

(65) Prior Publication Data

US 2020/0235253 A1    Jul. 23, 2020

(30) Foreign Application Priority Data

Jan. 17, 2019    (CN) .......................... 2019 1 0043058

(51) Int. Cl.
| | | |
|---|---|---|
| *H01L 31/0352* | (2006.01) | |
| *H01L 31/028* | (2006.01) | |
| *H01L 31/18* | (2006.01) | |
| *H01L 31/0216* | (2014.01) | |
| *H01L 31/103* | (2006.01) | |

(52) U.S. Cl.
CPC .... *H01L 31/035227* (2013.01); *H01L 31/028* (2013.01); *H01L 31/02162* (2013.01); *H01L 31/1037* (2013.01); *H01L 31/1804* (2013.01)

(58) Field of Classification Search
CPC ....... H01L 31/035227; H01L 31/02162; H01L 31/028; H01L 31/1804; H01L 31/1037
See application file for complete search history.

(56) References Cited

U.S. PATENT DOCUMENTS

| | | | |
|---|---|---|---|
| 8,710,488 B2 | 4/2014 | Yu et al. | |
| 9,263,613 B2 | 2/2016 | Yu et al. | |
| 2010/0186809 A1 | 7/2010 | Samuelson et al. | |
| 2011/0177683 A1* | 7/2011 | Kahen .................. | H01L 21/0256 438/509 |
| 2014/0326883 A1* | 11/2014 | Abdolvand ............... | G01J 5/16 250/338.1 |
| 2015/0097189 A1* | 4/2015 | Saitoh ............... | H01L 27/11582 257/66 |
| 2015/0194549 A1* | 7/2015 | Weman ............... | H01L 31/1828 136/244 |
| 2016/0163753 A1* | 6/2016 | Yu ....................... | H01L 27/1462 257/29 |
| 2018/0212024 A1* | 7/2018 | Cheng ............... | H01L 29/66439 |
| 2018/0212084 A1* | 7/2018 | Najar .................... | H01L 31/055 |
| 2018/0269285 A1* | 9/2018 | Sandow .............. | H01L 29/1095 |

* cited by examiner

*Primary Examiner* — Sitaramarao S Yechuri
(74) *Attorney, Agent, or Firm* — WPAT, PC

(57) ABSTRACT

A photodetector includes a substrate, at least one nanowire and a cladding layer. The at least one nanowire is disposed on the substrate and has a semiconductor core. The cladding layer is disposed on sidewalls of the semiconductor core and includes an epitaxial semiconductor film in contact with the sidewalls of the semiconductor core, a metal film disposed on the outside of the epitaxial semiconductor film and a high-k material layer disposed on the outside of metal film.

10 Claims, 3 Drawing Sheets

100

PHOTODETECTOR AND METHOD FOR FABRICATING THE SAME

This application claims the benefit of People's Republic of China application Serial No. 201910043058.7, filed Jan. 17, 2019, the subject matter of which is incorporated herein by reference.

BACKGROUND

Technical Field

The disclosure relates in semiconductor device and the method for fabricating the same, and more particularly to a photodetector and the method for fabricating the same.

Description of the Related Art

A photodetector (image sensor), such as a metal-oxide-semiconductor (MOS) image sensor or a charge coupled device (CCD) image sensor, that is a semiconductor device capable of converting an optical image into electrical signal has been widely used in consumer electronics, such as digital cameras, personal communications services (PCS), and game equipment. With the improvement of technology and the consumers demand for high-resolution color images, color image sensors that can sense multiple spectral colors have become the mainstream in the market.

Conventional color image sensors generally require additional color filters, which are not only complicated in process but also been easily deteriorated with the material of the color filters, and have strict Q-time limits in the process, and unable to rework, so it is not easy to be integrated with the processes for fabricating other semiconductor devices. As a result, the manufacturing costs is greatly increased and process yield is reduced.

In addition, since the conventional color image sensors generally require an additional micro-lens placed over each pixel to focus external light and then direct the focused light beam passing through a plurality of thick dielectric layers to reach the photo-detecting element, thus most portion of the light energy may loss to cause the light incidence efficiency significantly reduced.

Therefore, there is a need of providing an improved photodetector and the method for fabricating the same to obviate the drawbacks encountered from the prior art.

SUMMARY

One aspect of the present disclosure is to provide a photodetector, wherein the photodetector includes a substrate, at least one nanowire and a cladding layer. The at least one nanowire is disposed on the substrate and has a semiconductor core. The cladding layer is disposed on sidewalls of the semiconductor core and includes an epitaxial semiconductor film in contact with the sidewalls of the semiconductor core, a metal film disposed on an outer surface of the epitaxial semiconductor film not facing the sidewalls of the semiconductor core, and a high dielectric constant (high-k) material layer disposed on an outer surface of the metal film not facing the sidewalls of the semiconductor core.

Another aspect of the present disclosure is to provide a method for fabricating a photodetector, wherein the method includes steps as follows: A semiconductor substrate is firstly provided; at least one nanowire having a semiconductor core is then formed on the substrate. Next, a cladding layer is formed on sidewalls of the semiconductor core, wherein the cladding layer includes an epitaxial semiconductor film in contact with the sidewalls of the semiconductor core, a metal film disposed on an outer surface of the epitaxial semiconductor film not facing the sidewalls of the semiconductor core, and a high-k material layer disposed on an outer surface of the metal film not facing the sidewalls of the semiconductor core.

In accordance with the aforementioned embodiments of the present disclosure, a photodetector and the method for fabricating the same are provided. A semiconductor nanowire structure is used to serve as an optical receiver, and a surface treatment is then performed to healing the lattice damage occurred on the sidewalls thereof due to the previous steps of the fabricating process. Next, a cladding layer including an epitaxial semiconductor film, a metal film and a high-k material layer is formed on the sidewalls of the semiconductor nanowire structure. By selecting a predetermined material or structure parameters of the metal film and a predetermine wavelength of the light that enters into the semiconductor nanowire structure and then is absorbed by the metal film, a local resonance can occur between the metal film and the light; and more photogenerated electrons may thus be generated. The metal film can also serve as a selective light wavelength filter, by reflecting the portion of the external light that are not absorbed by the semiconductor nanowire structure, to take the place of the traditional color filter. Such that, the fabricating process of the photodetector can be simplified and the yield thereof can be significantly improved. In addition, the high-k material layer coated on the outer surface of the metal film can provide a depletion region between the semiconductor nanowire structure and the epitaxial semiconductor film to prevent the photogenerated electrons from escaping outward and to reduce light energy loss, thereby the quantum efficiency of the incident light can be improved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
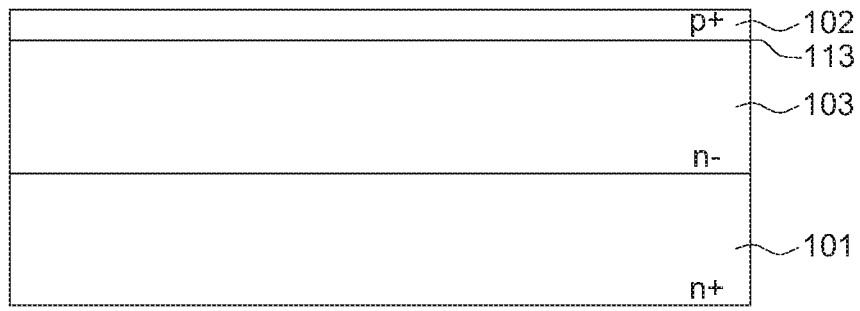
FIG. 1A to 1E are cross-sectional views illustrating a series of processing structure for fabricating a photodetector in accordance with one embodiment of the present disclosure.

The embodiments as illustrated below provide a photodetector and the method for fabricating the same to simplify the fabricating process, to improve the process yield thereof, to reduce light energy loss, and to increase the quantum efficiency of the incident light. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1A to 1E are cross-sectional views illustrating a series of processing structure for fabricating a photodetector 100 in accordance with one embodiment of the present disclosure. In the present embodiment, the method for fabricating the photodetector 100 includes steps as follows: A substrate 101 is firstly provided. In some embodiments of the present disclosure, the substrate 101 can be a silicon substrate, such as a silicon wafer. Next, a semiconductor material layer 102 having a conductivity different from that of the substrate 101 is formed on the substrate 101.

In some embodiments of the present disclosure, the substrate 101 can be a poly-silicon layer with an n type conductivity, the semiconductor material layer 102 can be a poly-silicon layer with a p type conductivity, and a P/N junction 113 can be formed between the substrate 100 and the semiconductor material layer 102. In some other embodiments of the present disclosure, the photodetector 100 may further include another semiconductor material layer 103 having a conductivity identical to that of the substrate 101, wherein the semiconductor material layer 103 is disposed between the substrate 101 and the semiconductor material layer 102. For example, in the present embodiment, the substrate 101 can be a poly-silicon layer with an n type conductivity and a higher doping concentration (expressed as n+), the semiconductor material layer 102 can be a poly-silicon layer with a p type conductivity and a higher doping concentration (expressed as p+), and the semiconductor material layer 103 disposed between the substrate 101 the semiconductor material layer 102 can be a poly-silicon layer with an n type conductivity and a lower doping concentration (expressed as n−), and a p-i-n junction (see FIG. 1A) can be formed among the substrate 101 the semiconductor material layer 103 and the semiconductor material layer 102.

Figure 1B:
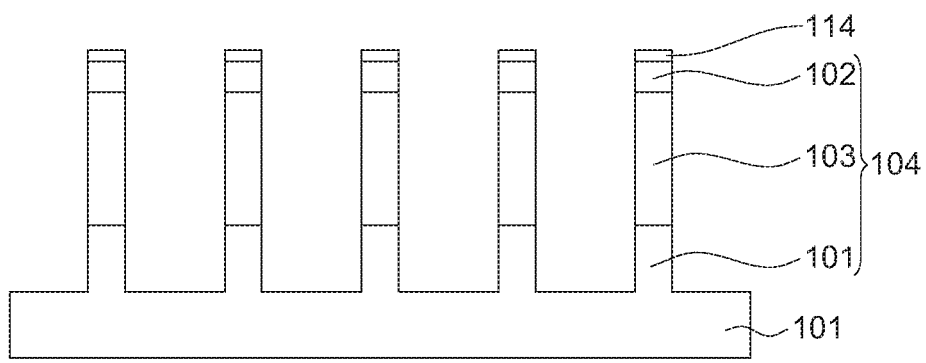
Figure 1C:
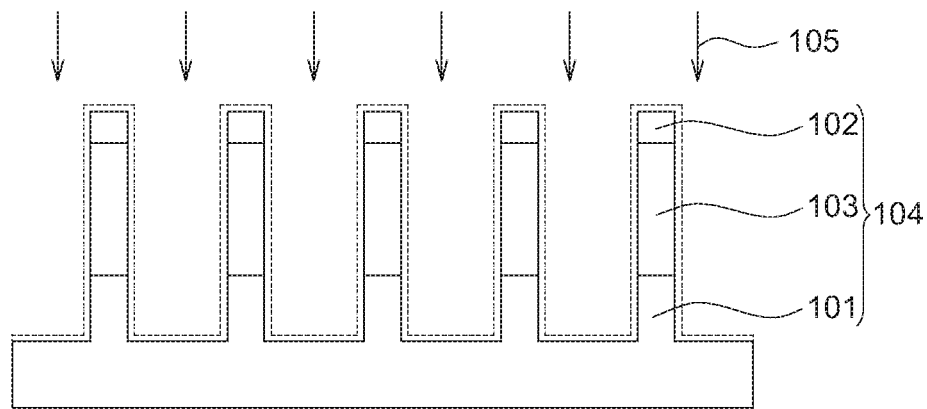

The substrate 101 the semiconductor material layer 103 and the semiconductor material layer 102 are then patterned, so as to form a plurality of nanowires 104 (see FIG. 1B). In some embodiments of the present disclosure, the process for patterning the substrate 101 the semiconductor material layer 103 and the semiconductor material layer 102 includes a step of performing an etching process, such as a reactive-ion etching (RIE) using a patterned hard mask layer 114 (e.g. a patterned silicon nitride layer) as an etching mask to remove portions of the substrate 101 the semiconductor material layer 103 and the semiconductor material layer 102, so as to make each of the nanowires 104 includes a semiconductor-core consisting of a portion of the substrate 101, a portion of the semiconductor material layer 103 and a portion of the semiconductor material layer 102. The nanowires 104 as described in the disclosure refers to a structure in which the semiconductor-core has a nanoscale (for example, 100 nanometer (nm) or less) thickness or diameter but not limit the length thereof.

After peeling off the patterned hard mask layer 114, the semiconductor-core of the nanowires 104 is subjected to a plasma annealing process (see FIG. 10). For example, in some embodiments of the present disclosure, the substrate 101 can be subjected to an thermal annealing process with a temperature about 850° C. in an reaction gas atmosphere (such as a hydrogen ($H_2$)-containing reaction gas atmosphere) to make $H_2$ reacting with the portion of the substrate 101, the portion of the semiconductor material layer 103 and the portion of the semiconductor material layer 102 that are used to constitute the semiconductor-core, whereby silane ($SiH_4$) can be generated for healing the lattice damage occurred on the sidewalls of the semiconductor-core, due to the patterning process.

Figure 1D:
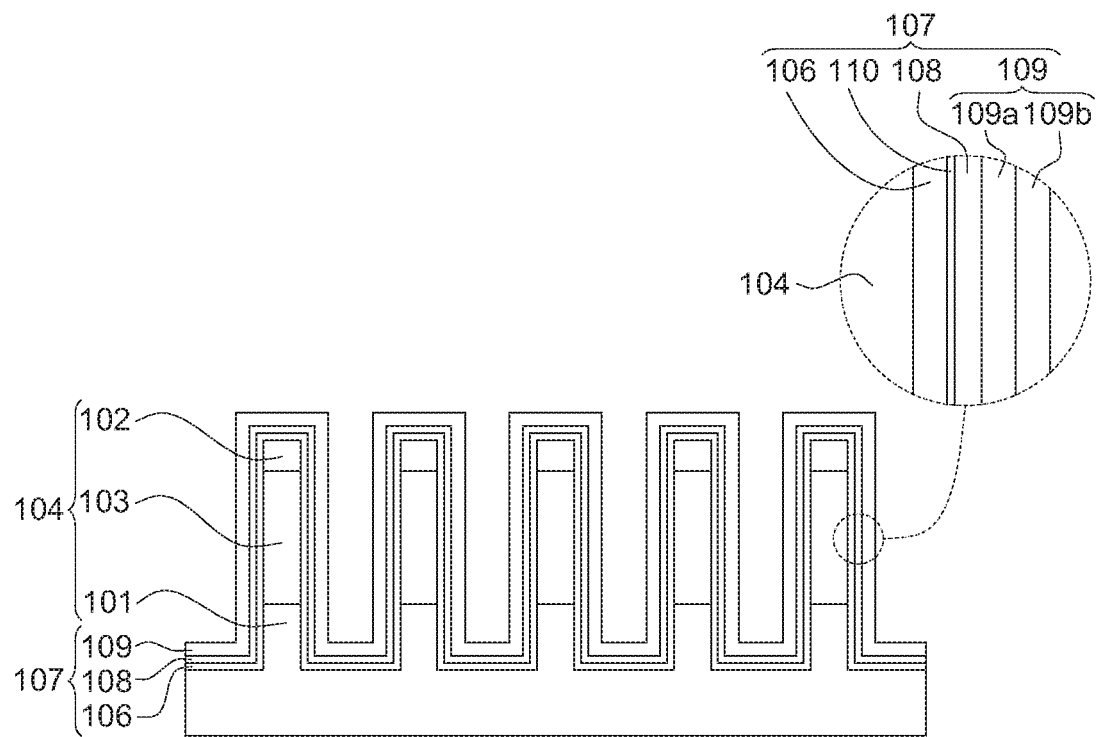
Figure 1E:
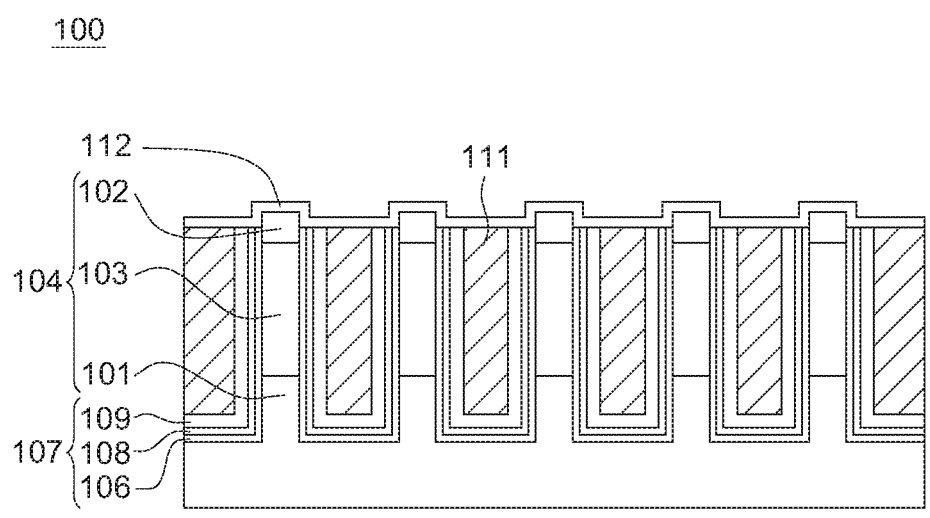

Subsequently, a cladding layer 107 is formed on sidewalls of each nanowire 104, wherein the cladding layer 107 may include an epitaxial semiconductor film 106, a metal film 108 and a high-k material layer 109 (see FIG. 1D). The process for forming the cladding layer 107 include steps as follows: An epitaxial growth process is firstly performed to form an epitaxial semiconductor film 106 on the sidewalls of the semiconductor core of each nanowire 104. In some embodiments of the present disclosure, the epitaxial semiconductor film 106 can be a p type (expressed as p+) epitaxial polysilicon layer doped with boron (B) ions having a thickness of 5 nanometer (nm). By the repairment of the epitaxial semiconductor film 106, a more complete crystal lattice structure of the semiconductor core of the nanowire 104 can be provided.

A metal film 108 is then formed on an outer surface of the epitaxial semiconductor film 106 not facing the sidewalls of the semiconductor core of the nanowires 104. For example, in some embodiments, the metal film 108 can be formed by a metal deposition process, such as an atomic layer deposition. The thickness of the metal film 108 may range from 2 nm to 5 nm. In the present embodiment, the metal film 108 can be a copper (Cu) film with a thickness about 2 nm. In addition, a barrier layer 110 may be formed on the outer surface of the epitaxial semiconductor film 106 prior to the forming of the metal film 108. In some embodiments, the barrier layer 110 may include tantalum nitride (TaN).

The metal film 108 (depending on the material it is composed of) can absorb a portion light having a specific wavelength and passing through the semiconductor core of the nanowire 104 and resonate therewith, meanwhile the portion of light not absorbed can be reflected back by it to provide a selective light wavelength filtering effect. For example, a Cu film can resonate with green light having a wavelength ranging from 495 nm to 570 nm. When the photogenerated electrons are absorbed by the Cu film, phonon oscillation or electron scattering occurs, and an electron cloud is formed on the sidewalls of the metal layer 108 close to the epitaxial semiconductor film 106, light thus can be further generated in the semiconductor core of the nanowires 104. Whereby, the light incidence efficiency can be significantly improved by the local surface plasmon resonance effect of photon and metal layer 108.

In some embodiments of the present disclosure, the metal film 108 can be an aluminum film with a thickness about 2 nm, and the aluminum film can resonate with red light having a wavelength ranging from 620 nm to 750 nm. When the photogenerated electrons are absorbed by the aluminum film, phonon oscillation or electron scattering occurs, and an electron cloud is formed on the sidewalls of the metal layer 108 close to the epitaxial semiconductor film 106, light thus can be further generated in the semiconductor core of the nanowires 104. Whereby, the light incidence efficiency can be significantly improved by the local surface plasmon resonance effect of photon and metal layer 108.

In addition, the thickness of the metal layer 108 and the microstructure characteristics of its surface, as well as the specific design parameters of the nanowire 104, such as the diameter and length of the semiconductor core, and the refractive index of the semiconductor core and the metal layer 108 layer, etc., also affect resonance and absorption of light of different wavelengths. Those skilled in the art can achieve selective filtering by adjusting the material, thickness or microstructure characteristics of the metal layer 108 or the parameters of the nanowire 104 described above.

Subsequently, a high-k material layer 109 is formed on the outside of the metal film 108. In some embodiments of the present disclosure, a deposition process, such as an atomic layer chemical vapor deposition (ALD CVD), can be applied to form the high-k material layer 109 with a thickness ranging from 2 nm to 10 nm. In some embodiments of the present disclosure, the high-k material layer 109 can be a composite material layer including a hafnium oxide ($HfO_2$) bulk layer 109a with a thickness of about 2 nm and a tantalum oxide (TaO) passivation layer 109b having a thickness of about 2 nm formed on an outer surface of the hafnium oxide ($HfO_2$) bulk layer 109a.

The high-k material layer 109 may serve as a charge reservoir, in which the $HfO_2$ bulk layer 109a can supply negative electric charge; and the TaO passivation layer 109b can supply positive electric charge for forming a depletion region between the metal layer 108 and the epitaxial semiconductor film 106 to effectively prevent the photogenerated electrons from escaping outward and from causing light energy loss.

After the cladding layer 107 is formed, a dielectric material 111, such as silicon oxide, is provided to overlay the substrate 101 and fill between the nanowires 104 to surround each of the nanowires 104. A portion of the dielectric material 111, a portion of the cladding layer 107, and a portion of the epitaxial semiconductor film 106 disposed at the top of the nanowires 104 may be removed by an etch back process, so as to expose a portion of the semiconductor material layer 102 of the semiconductor core of the nanowire 104. Then, a transparent electrode layer 112 is formed on the dielectric material 111 and the nanowires 104 (see FIG. 1E). Subsequently, the preparation of the photodetector 100 can be completed by performing a series of downstream processes (not shown). In some embodiments of the present disclosure, the transparent electrode layer 112 may include Indium Tin Oxide (ITO).

In accordance with the aforementioned embodiments of the present disclosure, a photodetector and the method for fabricating the same are provided. A semiconductor nanowire structure is used to serve as an optical receiver, and a surface treatment is then performed to healing the lattice damage occurred on the sidewalls thereof due to the previous steps of the fabricating process. Next, a cladding layer including an epitaxial semiconductor film, a metal film and a high-k material layer is formed on the sidewalls of the semiconductor nanowire structure. By selecting a predetermined material or structure parameters of the metal film and a predetermine wavelength of the light that enters into the semiconductor nanowire structure and then is absorbed by the metal film, a local resonance can occur between the metal film and the light; and more photogenerated electrons may thus be generated. The metal film can also serve as a selective light wavelength filter, by reflecting the portion of the external light that are not absorbed by the semiconductor nanowire structure, to take the place of the traditional color filter. Such that, the fabricating process of the photodetector can be simplified and the yield thereof can be significantly improved. In addition, the high-k material layer coated on the outer surface of the metal film can provide a depletion region between the semiconductor nanowire structure and the epitaxial semiconductor film to prevent the photogenerated electrons from escaping outward and to reduce light energy loss, thereby the quantum efficiency of the incident light can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A photodetector, comprising:
   a substrate;
   at least one nanowire, disposed on the substrate and having a semiconductor core, wherein the semiconductor core is a polysilicon core comprising a p type region, an n type region, and a P/N junction formed between the p type region and the n type region; and
   a cladding layer, disposed on sidewalls of the semiconductor core and comprising:
      an epitaxial semiconductor film, in contact with the sidewalls of the semiconductor core;
      a metal film, disposed on an outer surface of the epitaxial semiconductor film; and
      a high dielectric constant (high-k) material layer disposed on an outer surface of the metal film.

2. The photodetector according to claim 1, wherein the epitaxial semiconductor film is an epitaxial polysilicon film.

3. The photodetector according to claim 1, wherein the metal film comprises a tantalum nitride (TaN) berry layer and a copper (Cu) film.

4. The photodetector according to claim 1, wherein the high-k material layer comprises a hafnium oxide ($HfO_2$) bulk layer.

5. The photodetector according to claim 4, wherein the high-k material layer further comprises a tantalum oxide (TaO) passivation layer formed on an outer surface of the $HfO_2$ bulk layer.

6. The photodetector according to claim 1, further comprising a dielectric material to surround each of the nanowires.

7. The photodetector according to claim 6, further comprising a transparent electrode layer formed on the dielectric material and the nanowires.

8. A method for fabricating a photodetector, comprising:
   providing a substrate;
   forming at least one nanowire having a semiconductor core on the substrate, wherein the semiconductor core is a polysilicon core comprising a p type region, an n type region, and a P/N junction formed between the p type region and the n type region; and
   forming a cladding layer on sidewalls of the semiconductor core to make the cladding layer comprising:
      an epitaxial semiconductor film, in contact with the sidewalls of the semiconductor core;
      a metal film, disposed on an outer surface of the epitaxial semiconductor film; and
      a high-k material layer disposed on an outer surface of the metal film.

9. The method according to claim 8, further comprising steps of performing a hydrogen ($H_2$) annealing process on the semiconductor core, prior to the forming of the cladding layer.

10. The method according to claim 8, further comprising steps of:
   forming a dielectric material on the substrate to surround each of the nanowires; and forming a transparent electrode layer on the dielectric material and the nanowires.

* * * * *